United States Patent [19]

Sabe

[11] 4,096,435
[45] Jun. 20, 1978

[54] LEVEL INDICATING DEVICE

[75] Inventor: Ichiro Sabe, Yao, Japan

[73] Assignee: Sanyei Electronics, Corporation, Japan

[21] Appl. No.: 748,066

[22] Filed: Dec. 6, 1976

[30] Foreign Application Priority Data

Jun. 21, 1976 Japan .................................. 51-73529

[51] Int. Cl.² ...................... G01R 13/02; G01R 19/04
[52] U.S. Cl. ...................................... 324/122; 324/96; 324/103 P
[58] Field of Search ...................... 324/103 P, 96, 122, 324/133; 356/227

[56] References Cited

U.S. PATENT DOCUMENTS 3,818,495 6/1974 Sagara et al. .......................... 324/96

Primary Examiner—Rudolph V. Rolinec
Assistant Examiner—Ernest F. Karlsen
Attorney, Agent, or Firm—Eugene E. Geoffrey, Jr.

[57] ABSTRACT

A level indicating device having a plurality of diodes connected in series and a plurality of resistors connected in series with light emitting diodes connected between corresponding junctions of both series and means for applying a signal to be indicated to one end of one series and the other end of the other series.

4 Claims, 5 Drawing Figures

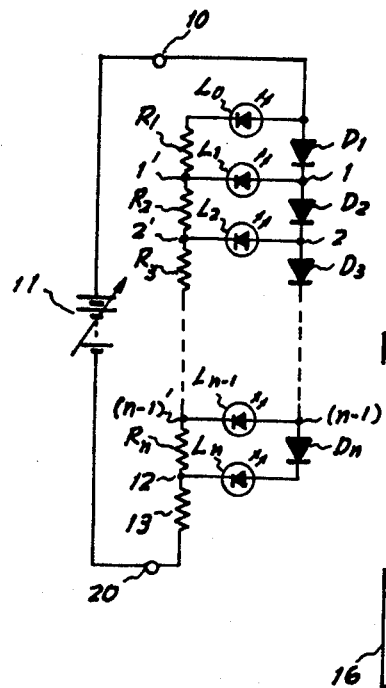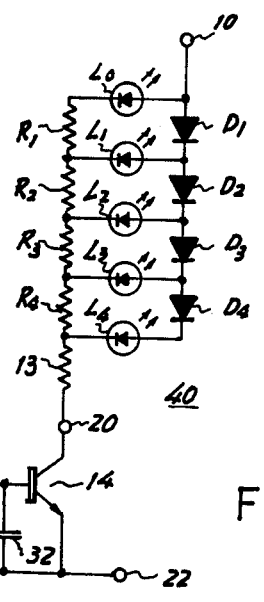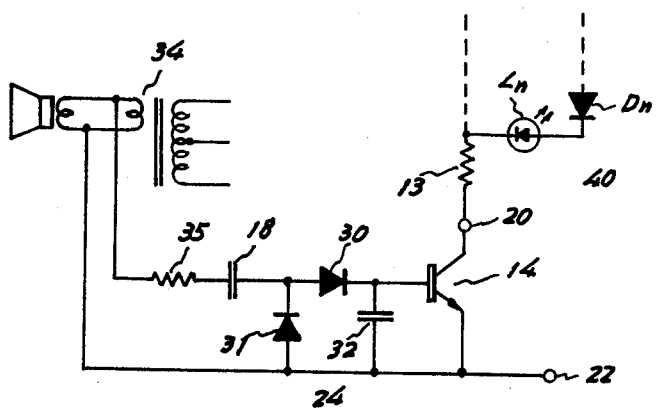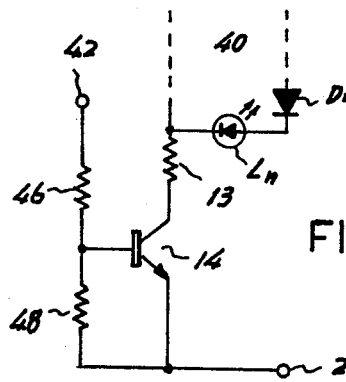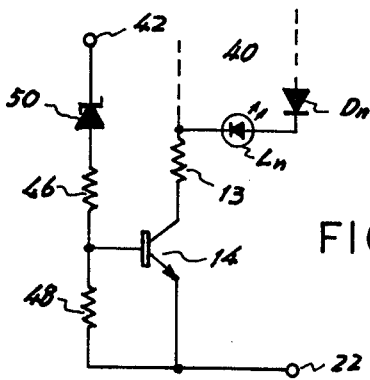
FIG. 1
FIG. 2
FIG. 3
FIG. 4
FIG. 5

LEVEL INDICATING DEVICE

This invention relates to a novel and improved level indicating device which is especially useful to indicate visually signal level, source voltage and the like.

Although analog indicators and meters have been used generally fo this purpose, they often go out of order and are less reliable since they have many mechanically moving portions, and they are inconvenient for use since they require illuminating means for reading when ambient illumination is poor.

Accordingly, an object of this invention is to provide a novel and improved level indicating device which has high reliability and long life, and furthermore, can be read in poorly lighted areas without use of illumination.

This object can be attained by the device of this invention, which comprises first and second terminals for receiving a signal the level of which is to be indicated, a first series connection of a plurality of similarly poled diodes having series joints therebetween and first and second ends, a second series connection of a plurality of resistors of the same number as said diodes having series joints therebetween and first and second ends, a plurality of similarly poled light emitting diodes connected respectively between the corresponding ones of said series connections, thereby bridging the both series connections to form a ladder-like configuration, and said first end of said first series connection and said second end of said second series connection being connected respectively to said first and second terminals.

Other objects and features of this invention will be described in detail hereinunder with reference to the accompanying drawings.

In the drawings:

FIG. 1 is a circuit diagram illustrating a basic circuit configuration of the level indicating device according to this invention; and FIGS. 2 through 5 are circuit diagrams illustrating four examples of level indicating devices, in which the circuit of FIG. 1 is embodied.

Throughout the drawings, like reference numerals and symbols are used to denote corresponding components.

Referring to FIG. 1, the circuit includes a pair of terminals 10 and 20 which are connected to a variable voltage source 11, the voltage level of which is to be indicated. A series connection of similarly poled diodes $D_1, D_2, D_3, \ldots D_n$ havng joints $1', 2', \ldots (n-1)'$ is also provided and the free end 12 of the last resistor $R_n$ is connected through a protection resistor 13 to the other terminal 20. A light emitting diode $L_O$ is connected between the anode of the first diode $D_1$ and the free end of the first resistor $R_1$, similar light emitting diodes $L_1$, $L_2, \ldots L_{n-1}$ are connected respectively between the joints 1 and $1'$, 2 and $2', \ldots (n-1)$ and $(n-1)'$ and a further similar light emitting diode $L_n$ is connected between the free end (cathode) of the last diode $D_n$ and the joint 12 of the resistors $R_n$ and 13. All of the light emitting diodes $L_0, L_1, L_2, \ldots L_n$ are similarly poled as shown. The diodes $D_1, D_2, D_3, \ldots D_n$ may be silicon diodes having the same characteristics. These diodes serve the function of making abrupt the forward voltage-to-current characteristics of the light emitting diodes $L_0, L_1, L_2, \ldots L_n$, thereby clarifying the distinction between actuation and deactuation of the respective light emitting diodes.

In the above level indicating device, all of the light emitting diodes are not actuated when the voltage level of the voltage level source 11 is low and the voltage across the first light emitting diode $L_0$ does not exceed its threshold voltage. However, when the source voltage rises and the voltage across the light emitting diode $L_0$ reaches its threshold voltage, it is actuated to emit a light. When the source voltage rises further and the voltage drop across the series connection of the light emitting diode $L_0$ and the resistor $R_1$ increases until the voltage across the diode $D_1$ exceeds its current originating voltage, the light emitting diode $L_1$ is also actuated in addition of the first light emitting diode $L_O$. In this fashion, the light emitting diodes $L_2, L_3, \ldots L_n$ are actuated sequentially with increases of the source voltage and, therefore, the magnitude of the source voltage is indicated by the number of the actuated light emitting diodes.

The relation between the source voltage and the number of actuated light emitting diodes can be determined not only in linear fashion but also in logarithmic, inverse logarithmic or any other fashion, by selecting the diodes $D_1, D_2, D_3, \ldots D_n$ having appropriate current originating voltages respectively, instead of those having the same characteristics.

In operation, the current of the light emitting diode $L_0$ flows through the resistor $R_1$, the currents of the light emitting diodes $L_0$ and $L_j$ flow through the resistor $R_2$ and the currents of all light emitting diodes flow through the resistor 13. Accordingly, if the resistor 13 is selected to be sufficiently large, most of the voltage between the terminals 10 an 20 is shared between the series resistors after the actuated light emitting diodes and no significant change occurs in the voltages across the light emitting diodes or in the currents therethrough, regardless of the number of actuated light emitting diodes, that is, the level of the source voltage. It is a matter of course that the current of the each light emitting diode can be individually confined to any value, if necessary, by selecting the values of the resistors $R_1, R_2, \ldots R_n$, appropriately. The protection resistor 13 may be omitted as occasion demands.

Referring to FIG. 2, a tuning indicator is shown in which the level indicating device 40 of this invention is embodied. In this embodiment, five light emitting diodes $L_0, L_1, L_2, L_3$ and $L_4$ are included in the device 40. The terminal 20 is connected through the collector-to-emitter path of a transistor 14 to a terminal 22. The base electrode of the transistor 14 is connected to a voltage doubler circuit 24 including diodes 30 and 31 and a capacitor 32. The signal to be indicated is supplied from an intermediate frequency amplifier 16 through a capacitor 18 to the voltage doubler circuit 24.

When a predetermined fixed voltage is applied between the terminals 10 and 22, the light emitting diodes are actuated depending upon the degree of conduction of the transistor 14, and accordingly, upon the degree of tuning, and the latter will be known from the number of actuated light emitting diodes. Due to the characteristic of the transistor 14, in this circuit, the relation between the output voltage of the intermediate frequency amplifier 16 and the number of actuated light emitting diodes becomes inversely logarithmic.

Referring to FIG. 3, a circuit is shown in which the level indicating device 40 of this invention is used for indicating th output level of an amplifier. Although the circuit of this embodiment is essentially same as that of FIG. 2, the signal to be indicated is applied to the capacitor 18 through a resistor 35 from the secondary winding of an output transformer 34, instead of the intermediate frequency amplifier 16. If the condition is adjusted previously such that a suitable number of light emitting diodes are actuated by a conventional output level by selecting the value of the resistor 35, the degree of conformity of the output level can be distinctly distinguished. This circuit can be utilized, among other things, for indicating the recording and reproducing levels of a tape recorder.

FIG. 4 shows an embodiment of the invention in which the level indicating device 40 is used for indicating a source voltage. In this circuit, instead of the voltage doubler circuit 24 of FIG. 2, a voltage divider circuit consisting of resistors 46 and 48 is connected to the base electrode of the transistor 14, and the source voltage to be indicated is applied between the free end 42 of the resistor 46 and the terminal 22. In this embodiment, the relation between the source voltage and the number of actuated light emitting diodes depends upon the base-emitter voltage to collector current characteristic. In this circuit, the light emitting diodes can be sequentially actuated over a wide range of variation of the source voltage such as 5 volts to 10 volts.

FIG. 5 shows a variation of the circuit of FIG. 4. In this embodiment, zener diode 50 is inserted between the resistor 46 and the terminal 42 of FIG. 4. When the source voltage is supplied between the terminals 42 and 22 of FIG. 5, the zener voltage of the zener diode 50 is subtracted from the source voltage and the residue is applied through the voltage dividing circuit to the base electrode of the transistor 14. Accordingly, in this circuit, the number of actuated light emitting diodes can be changed by a slight change of the source voltage, and, for example, a change of the source voltage in a range from 9 volts to 10 volts can be indicated.

As described above, the level indicating device of this invention has high reliability and long life due to lack of moving portions and, moreover, can give a bright indication even under dark conditions.

It should be noted that the above embodiments are presented only for explanation purposes and various modifications and changes can be made without departing from the scope of this invention as defined in the appended claims.

What is claimed is:

1. A level indicating device comprising first and second terminals for receiving a signal having a level to be indicated, a first plurality of similarly poled serially connected diode devices having junctions therebetween and first and second ends, a second plurality of serially connected resistive devices of the same number as said diodes having junctions therebetween and first and second ends, a plurality of light emitting diodes each connected between corresponding junctions of said first and second sets of series connected devices and between the first and second ends of both said sets of series connected devices, whereby said light emitting diodes bridge both of said sets of series connected devices to form a ladder-like configuration, and said first end of said first set of series connected devices and said second end of said second set of series connected devices are connected respectively to said first and second terminals.

2. A level indicating device according to claim 1 wherein a resistor is inserted between said second end of said second set of series connected and said second terminal.

3. A level indicating device according to claim 1 wherein said device further comprises a transistor having a collector-to-emitter path connected between said second end of said second set of series connected devices and said second terminal, and the signal to be indicated is applied to the base electrode of said transistor.

4. A level indicating device according to claim 3 wherein a zener diode is connected to the base electrode of said transistor, and the signal to be indicated is applied through said zener diode to said base electrode.

* * * * *